US009136089B2

(12) United States Patent
Wang

(10) Patent No.: US 9,136,089 B2
(45) Date of Patent: Sep. 15, 2015

(54) PATTERN DIMENSION MEASURING DEVICE, CHARGED PARTICLE BEAM APPARATUS, AND COMPUTER PROGRAM

(71) Applicant: Hitachi High-Technologies Corporation, Minato-ku, Tokyo (JP)

(72) Inventor: Zhigang Wang, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/379,659

(22) PCT Filed: Feb. 18, 2013

(86) PCT No.: PCT/JP2013/053787
§ 371 (c)(1),
(2) Date: Aug. 19, 2014

(87) PCT Pub. No.: WO2013/129148
PCT Pub. Date: Sep. 6, 2013

(65) Prior Publication Data
US 2015/0041649 A1    Feb. 12, 2015

(30) Foreign Application Priority Data

Feb. 28, 2012   (JP) ................................. 2012-040869

(51) Int. Cl.
*G01N 23/00*   (2006.01)
*H01J 37/26*   (2006.01)
(Continued)

(52) U.S. Cl.
CPC ............. *H01J 37/265* (2013.01); *G06K 9/3216* (2013.01); *G06K 9/6202* (2013.01);
(Continued)

(58) Field of Classification Search
CPC ....... H01J 37/265; H01J 37/28; H01J 37/222; H01J 2237/2817; H01J 2237/2809; H01J 2237/2806; H01J 2237/24578; G06K 9/6202; G06K 9/3216
USPC ................... 250/306, 307, 310, 311
See application file for complete search history.

(56) References Cited

U.S. PATENT DOCUMENTS

2006/0219907 A1*  10/2006  Ogashiwa et al. ............ 250/310
2008/0073528 A1    3/2008  Sasaki et al.
(Continued)

FOREIGN PATENT DOCUMENTS

JP           5-243136 A    9/1993
JP          10-31968 A    2/1998
(Continued)

OTHER PUBLICATIONS

Corresponding International Search Report dated May 14, 2013 with English Translation (four (4) pages).

*Primary Examiner* — Michael Maskell
(74) *Attorney, Agent, or Firm* — Crowell & Moring LLP

(57) ABSTRACT

The present invention aims at providing a pattern dimension measuring device that realizes the measurement of a dimension of a pattern difficult to set up a measurement box, or between patterns away from each other with high precision. In order to achieve the above object, a pattern dimension measuring device is proposed which moves a field of view with reference to a first pattern formed on the specimen on the basis of predetermined first distance information, acquires a first image, executes template matching with the use of the first image and a matching template, and calculates a distance between a second pattern included in the first image and the first pattern on the basis of second distance information obtained by the template matching, and the first distance information.

8 Claims, 10 Drawing Sheets

(51) Int. Cl.
  *H01J 37/22* (2006.01)
  *G06K 9/32* (2006.01)
  *G06K 9/62* (2006.01)
  *H01J 37/28* (2006.01)

(52) U.S. Cl.
  CPC ............. *H01J37/222* (2013.01); *H01J 37/28* (2013.01); *H01J 2237/24578* (2013.01); *H01J 2237/2806* (2013.01); *H01J 2237/2809* (2013.01); *H01J 2237/2817* (2013.01)

(56) References Cited

U.S. PATENT DOCUMENTS

2008/0210865 A1  9/2008  Nakagawa et al.
2011/0133066 A1  6/2011  Nozoe et al.
2011/0174975 A1  7/2011  Sasaki et al.

FOREIGN PATENT DOCUMENTS

| | | | |
|---|---|---|---|
| JP | 2003-197138 | A | 7/2003 |
| JP | 2006-173038 | A | 6/2006 |
| JP | 2007-194060 | A | 8/2007 |
| JP | 2008-84626 | A | 4/2008 |
| JP | 2008084626 | A * | 4/2008 |
| JP | 2008-218115 | A | 9/2008 |
| JP | 2010-73703 | A | 4/2010 |
| JP | 2011-8968 | A | 1/2011 |
| JP | 5243136 | B2 * | 7/2013 |

* cited by examiner

FIG. 2
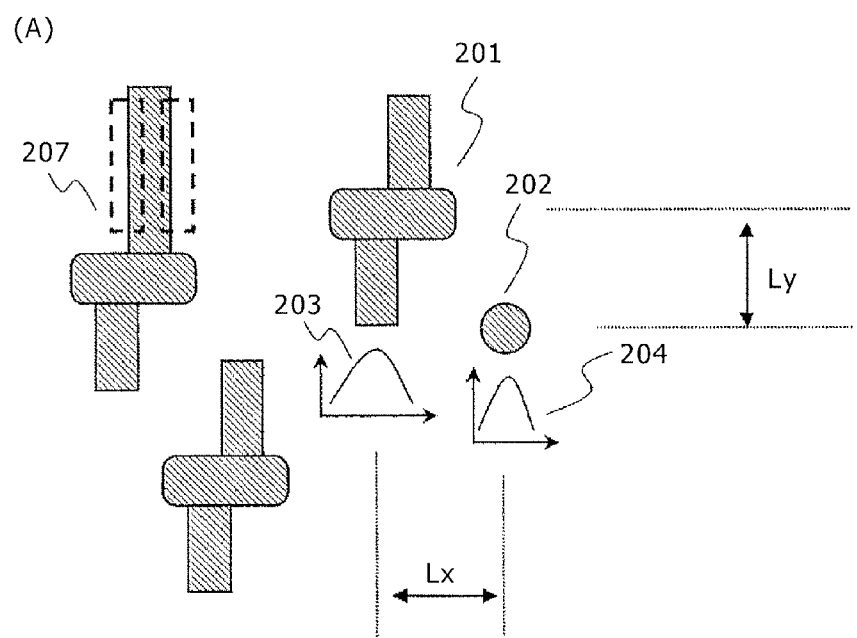
(A)
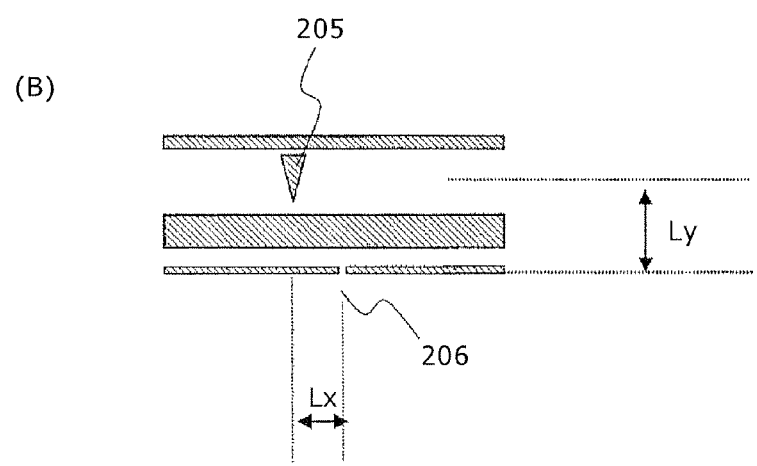
(B)

(A)

(B)

PATTERN DIMENSION MEASURING DEVICE, CHARGED PARTICLE BEAM APPARATUS, AND COMPUTER PROGRAM

TECHNICAL FIELD

The present invention relates to a pattern dimension device and a computer program, and more particularly to a pattern dimension measuring device that measures distances between plural patterns, and a computer program therefor.

BACKGROUND ART

A scanning electron microscope that is one of the charged particle beam apparatuses is configured to detect electrons obtained by scanning a specimen with an electron beam, and display a signal based on the detected electrons on a screen in synchronization with the scanning of the electron beam, to thereby obtain a fine enlarged image to be observed. The object to be observed is frequently very fine, thereby making it very difficult to find out a field of view to be scanned with the electron beam in an extensive area relative to the object to be observed. Hence, a technique has been used in which a reference pattern for searching a visual field position is provided, and the field of view is positioned to the object to be observed after the field of view has matched the reference pattern.

Patent Literature 1 discloses that an image of an alignment mark set up on a die is acquired in plural times, and a shift from center coordinates of the image of the alignment mark is set as a coordinate correction value. Patent Literature 2 discloses that two different scanning images included in the image operating the same mark are acquired, the two scanned images are acquired within the same scanning period, and the mark positions within the two scanned images are compared with each other to obtain a positional shift between the scanned images. Patent Literature 3 discloses that two scanning signal images are acquired, and a shift amount of the two images is calculated by pattern matching of the two images to automatically adjust an axis of an electron lens. Patent Literature 4 discloses that when a reference image for drift detection is acquired, an image different in the image shift amount is acquired at the same time, an image shift sensitivity is measured as needed, and the drift amount detection and the image shift control (drift correction) are conducted according to the reference image and the image shift sensitivity.

CITATION LIST

Patent Literature

Patent Literature 1: Japanese Unexamined Patent Application Publication No. 2010-073703 (corresponding U.S. Patent Publication NO. US2011/0133066)
Patent Literature 2: Japanese Unexamined Patent Application Publication No. 2011-008968
Patent Literature 3: Japanese Unexamined Patent Application Publication No. 2007-194060
Patent Literature 4: Japanese Unexamined Patent Application Publication No. 2006-173038 (corresponding U.S. Patent Publication NO. US2006/0219907)

SUMMARY OF INVENTION

Technical Problem

On the other hand, devices that measure the dimension of the fine patterns with the use of the scanning electron microscope have been required to accept diverse measurements because of the diversification of the structures of semiconductor devices, and the diversification of process management methods in recent years. For example, patterns poor in their edges which are measurement references have been found here and there due to the diversification of the pattern shape. As one technique for measuring the pattern dimension, there is a technique in which luminance signals in a direction perpendicular to a measurement direction are averaged to create a luminance profile for measuring the dimensions. When this measurement is conducted, there is a need to setup a measurement box for extracting the luminance signal. However, if the shape of an edge portion is complicated, it is difficult to find out a reference position, resulting in difficulty in the measurement.

Also, there is a request for measurement of the dimension between the patterns away from each other. In this case, the plural patterns to be measured which are away from each other need to fall within the field of view of the scanning electron microscope. However, because the measurement is conducted with the use of an image of as low magnification as the patterns are away from each other, a measurement precision is reduced.

According to the positioning techniques using the reference patterns disclosed in Patent Literatures 1 to 4, desired measurement and inspection positions can be specified with precision. However, those techniques do not consider that the dimension of the patterns difficult to install the measurement box, or the dimension between the patterns away from each other is measured.

Hereinafter, the present invention proposes a pattern dimension measuring device and a computer program which are intended to realize the measurement of the dimension of the pattern difficult to install the measurement box, or the dimension between the patterns away from each other with high precision.

Solution to Problem

According to one aspect of achieving the above object, there is proposed a pattern dimension measuring device and a computer program, which move a field of view with reference to a first pattern formed on the specimen on the basis of predetermined first distance information, acquire a first image, execute template matching with the use of the first image and a matching template, and calculate a distance between a second pattern included in the first image and the first pattern on the basis of second distance information obtained by the template matching, and the first distance information.

Also, according to another aspect of achieving the above object, there is described a charged particle beam apparatus including an arithmetic unit that corrects a dimension between a reference pattern and a different pattern on the basis of a shift of the amount of deflection obtained on the basis of pattern matching using an image obtained when deflecting the charged particle beam from the reference pattern to the different pattern, and scanning the different pattern with the charged particle beam.

Advantageous Effects of Invention

According to the above configuration, the measurement of the dimension of the pattern difficult to set up the measurement box, and between the patterns away from each other can be conducted with high precision.

BRIEF DESCRIPTION OF DRAWINGS

FIGS. 2A and 2B are diagrams illustrating a semiconductor pattern and magnetic head pattern distance measurement.

DESCRIPTION OF EMBODIMENTS

Figure 1:
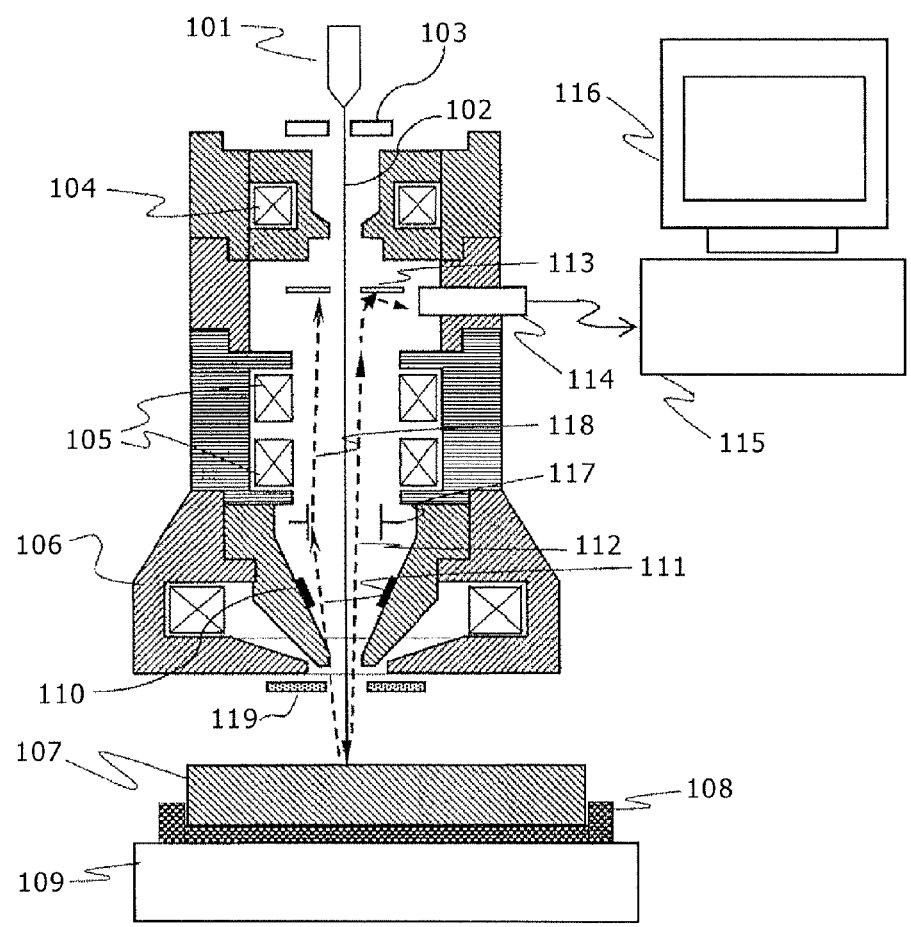
FIG. 1 is a schematic configuration diagram of a scanning electron microscope (SEM).

An embodiment described below relates to a method and a device suitable to measure a distance between arbitrary patterns with high precision, and a computer program that causes a computer to execute the measurement.

As an analyzing device for a specimen surface, a device that scans the surface with a charged particle beam probe, and analyzes the amount or energy of a signal such as emitted secondary electrons, ions, or electromagnetic waves to analyze a surface texture is advantageous in that information on a fine shape and a component element of the surface is easily obtained. In particular, a scanning electron microscope (SEM) that converts the amount of secondary electrons into luminance on a screen to obtain a surface profile image with electrons as a probe, and secondary electrons as an emitting signal can conduct the dimension measurement and the inspection of the fine pattern.

In the scanning electron microscope, signal electrons low in the energy which are emitted by allowing an electron beam to arrive at a specimen to excite atoms in the specimen surface are called "secondary electrons". When an edge portion of the specimen having unevenness like a circuit pattern of semiconductor is irradiated with the electron beam, the amount of secondary electrons generated by the edge effect increases to form an image having a contrast depending on the unevenness. Also, electrons obtained by bouncing the electron beam against the specimen surface without arriving at the specimen are called "reflected electrons (or backscattered electrons)". The reflected electrons are signal electrons high in the energy, and form an image having a contrast depending on the specimen composition without depending on the unevenness of the specimen. A reflected electron signal is detected from a magnetic head having a flat specimen surface, or a semiconductor specimen difficult to observe by the secondary electron signal caused by a part of charge to obtain a clear image. With the detection of the secondary electrons or the reflected electrons, a two-dimensional image that reflects a surface shape of the specimen can be acquired. Also, the shape and the dimension of the pattern can be measured on the basis of the detected signal.

In the development or production of hard disks in the most advanced semiconductor technology advanced in miniaturization to a nano-level, a demand for processing dimensions in manufacturing becomes increasingly severe with higher integration or miniaturization in recent years. This leads to a severe demand for precision of the dimension measurement.

In the development or production of hard disks in the most advanced semiconductor technology advanced in miniaturization to the nano-level, the dimension measurement is extensively conducted with the use of a length measurement SEM (CD-SEM: critical dimension SEM) for measuring the shape of the pattern or the dimension of a line width. With the higher integration and miniaturization in recent years, the demand for the processing dimension in manufacturing becomes increasingly severe with the result that the precision of the dimension measurement is severely demanded. On the other hand, with the higher integration and miniaturization, a demand for the measurement is also diversified. Because of the complicated pattern shape per se, the arrangement of the measurement box may be difficult. The pattern shape measurement in the extensive range by a lithography simulation is required, and the past technique acquires an image at a low magnification, and the measurement precision may not satisfy the requirement. Also, the management of the pattern arrangement of the lithography is necessary, and the measurement of a distance between the patterns with high precision is also required.

Hereinafter, a dimension measuring device that conducts the dimension measurement with high precision by the combination of a dimension measurement based on a beam deflection with a dimension measurement based on high magnification image matching, and a computer program that causes a computer to execute the above dimension measurement will be described in detail.

Specifically, the respective patterns are acquired at a high magnification with the inclusion of a given reference point, and a beam deflection amount, and the pattern to be measured, and a beam deflection amount from the reference point are recorded. Then, pattern matching with model data registered in advance is conducted, and a shift of the deflection amount is corrected at a sub-pixel level to obtain a distance between the measurement patterns with high precision.

Because the dimension between the patterns is obtained on the basis of the deflection of the beam and the pattern matching, there is no need to set up a measurement box in a pattern edge. Also, even if all of patterns to be measured do not fall within one field of view, the measurement can be conducted. For that reason, even the dimension measurement of the pattern having a complicated edge shape or between the patterns away from each other can be realized with high precision.

Hereinafter, a measurement method using the deflection of a beam and the pattern matching will be described on the basis of the drawings. FIG. 2 (A) illustrates an example of a pattern of a semiconductor device specimen, and (B) illustrates an example of a pattern formed on a magnetic head. The patterns described below are exemplary, and not limited to this configuration.

Referring to FIG. 2 (A), a contact hole pattern 202 is arranged on the right side of several line patterns 201. The lithography shows a two-dimensional Gaussian distribution as with intensity distributions 203 and 204 which are the respective lithographic intensity distributions of the line patterns 201 and the hole pattern. For example, when a distance between the line patterns 201 and the contact hole pattern 202 is short, those patterns have the potential to be short-circuited. This is because the respective tails of the intensity distributions 203 and 204 overlap with each other, to thereby increase the lithographic intensity of the overlapped portion. On the other hand, from the viewpoint of the miniaturization of the semiconductor device, it is desirable that the number of patterns per unit area is larger. Hence, there is a need to rigorously manage an arrangement interval between plural patterns that are arranged within a limited area.

However, when one of the patterns to be measured is a circular pattern, because the edge is curved, it may be difficult to set up, for example, a rectangular measurement box. Also, it is conceivable to set up the measurement box corresponding to the pattern shape. However, there is a need to prepare the measurement boxes corresponding to the diverse pattern shapes by the recent miniaturization and complication of the patterns, which is really difficult.

When the pattern is optimized on the basis of the verification of optical proximity effects, the dimension measurement needs to be conducted on an object to be measured which is present within an extensive range of about tens of μm with high precision. Likewise, when the magnetic heat is to be measured, if a high magnification image of the edge portion is acquired to conduct high precision signal processing on the edge portion which is a measurement reference, two edges to be measured may not fall within the field of view. FIG. 2 (B) is a diagram illustrating an outline of the magnetic head. In the magnetic head, a write portion 205 and a read portion 206 of the magnetic head need to be patterned at respective appropriate positions. That is, in order to appropriately manage the magnetic head, there is a need to precisely measure a distance between those two portions. However, because the arrangement of the measurement box is difficult, and the distance between those portions is far, it is difficult that two of the write portion 205 and the read portion 206 fall within one high magnification image.

In the embodiment described below, the respective patterns are acquired at a high magnification with the inclusion of a given reference point, and the pattern to be measured, and a beam deflection amount from the reference point are recorded. An example will be described in which pattern matching with model data registered in advance is conducted, a shift of the deflection amount is corrected at a sub-pixel level, and a distance between the measurement patterns is obtained with high precision.

In the embodiment described below, an SEM or a control device mounted on the SEM, or a control device connected to the SEM through a communication circuit will be exemplified. However, the present invention is not limited to this configuration, but the above measuring process may be conducted by a computer program with the use of a general-purpose arithmetic device. Also, the present invention can be applied to a case in which the specimen is observed and measured by another charged particle beam apparatus such as a focused ion beam apparatus.

First Embodiment

FIG. 1 is a schematic configuration diagram of a scanning electron microscope (SEM). An electron beam 102 generated from an electron gun 101 is accelerated by an accelerating electrode 103, converged by a condenser lens 104, and deflected by a deflector 105. Thereafter, the electron beam 102 is decelerated by a negative voltage (retarding voltage) applied to a specimen 107 side, finally converged into an electron beam of several nm (nanometer) in diameter by an objective lens 106, and input to a surface of the specimen 107 to be observed.

A part of the input primary electrons is reflected backward into reflected electrons 111 (backscattered electrons), and another part of the primary electrons generates secondary electrons 112 while scattering within the specimen. In this example, the retarding voltage is a negative voltage which is applied to the specimen 107 (a specimen holder 108 or a specimen stage 109) side for the purpose of converging the electron beam 102 without damaging a circuit pattern on the specimen 107. With the above operation, an irradiation energy of the electron beam 102 is controlled. The reflected electrons 111 and the secondary electrons 112 thus generated collide with a reflective plate 113 to generate new electrons, and the new electrons are detected by a detector 114. A photomultiplier tube is incorporated into the detector 114, and generates a voltage according to a detection amount of the electrons. Therefore, after the voltage thus generated has been processed in a signal processing device 115, the voltage is displayed as an image in an image display unit 116. The signal processing device 115 forms a profile waveform with the axis of ordinate as a signal amount, and the axis of abscissa as a scanning position of the electron beam, on the basis of the secondary electrons emitted from the specimen. A distance between peaks of the profile waveform is obtained to measure the pattern dimension.

Subsequently, optical conditions of the secondary electrons 112 and the reflected electrons 111 when conducting the signal detection will be described. The secondary electrons are low energy signal electrons lower than about 50 eV, and the reflected electrons are high energy signal electrons of about 50 eV or higher. For that reason, the voltages applied to the respective electrodes configuring the SEM, and the other optical parameters are controlled to select those signal detections, and switch those detections. The above conditions are set in (1) an electron optical system or/and (2) an electron detection system.

In the item (1), the secondary electron signal detection amount increases more as a value of an incident voltage obtained by subtracting a negative voltage (retarding voltage Vr, etc.) for decelerating the electron beam 102 irradiated from the electron gun 101 from a positive accelerating voltage Va for accelerating the electron beam 102 to the specimen 107 side is larger in the positive direction. On the contrary, the reflected electron signal detection amount increases more as the value is larger in the negative direction. Also, when a negative voltage (booster voltage) larger than a voltage of the specimen 107 side is applied to a booster electrode 110 arranged above an opposed electrode 119 and the objective lens 106, the secondary electrons 112 low in the energy can be pulled back to the specimen 107 side, and only the reflected electrons 111 of the high energy can be selectively detected. In this case, a positive voltage is applied to a conversion electrode 117, and the reflected electrons 111 that have moved to the electron gun 101 side of the objective lens 106 are further raised, and introduced into the detector 114.

When the reflected electrons 111 are detected through the above method, even if charge is generated on the surface of the specimen including an insulating material, there is advantageous in that the image can be formed without advancing the charge on the specimen surface.

Figure 8:
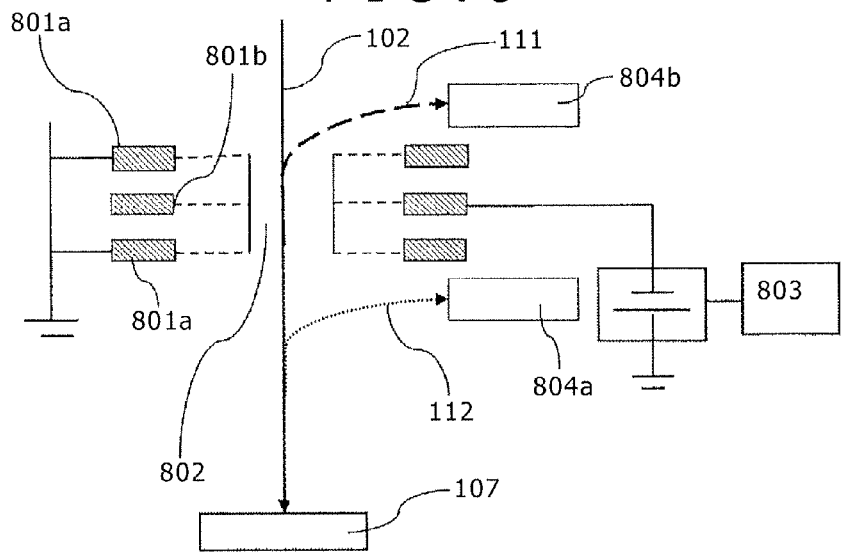
FIG. 8 is a basic configuration diagram of an energy filter.

In the item (2), a method using an energy filter that separates the electrons generated from the specimen 107 side according to the magnitude of energy is applied. FIG. 8 illustrates a basic structure of the energy filter. The energy filter includes two shield meshes 801a and a filter mesh 801b. Also, those meshes are provided with an opening 802 for allowing the electron beam 102 to pass therethrough. The number of shield meshes 801a may be single or plural, and the shield meshes 801a are connected with a power supply 803 for applying a filter voltage. The reflected electrons 111 and the secondary electrons 112 which have been separated according to the magnitude of energy are detected by a reflected electron detector 804a and a secondary electron detector 804b, respectively.

In the above method, because the respective detectors can detect the electrons surely separated according to the energy, the resolution becomes enhanced. The above methods of (1) and (2) can be appropriately combined according to a purpose or an intended use such as the semiconductor device pattern having unevenness or the flat magnetic head pattern. In switching an electron optical system, an accurate measured value can be ensured by calibrating the device in advance.

Also, this embodiment is not limited to the above items (1) and (2), and besides those conditions, optical parameters such as a voltage or a current which are applied or supplied to the other electrode or coil configuring the SEM can be controlled to set up the signal detection optical conditions of the reflected electrons 111 and the secondary electrons 112.

The voltage or the current is applied or supplied to respective electrode and coil configuring the SEM by a control device which will be described later in FIG. 9. The control device includes an arithmetic device, and the arithmetic device controls the device on the basis of an operation program of the SEM that is called "recipe".

Figure 9:
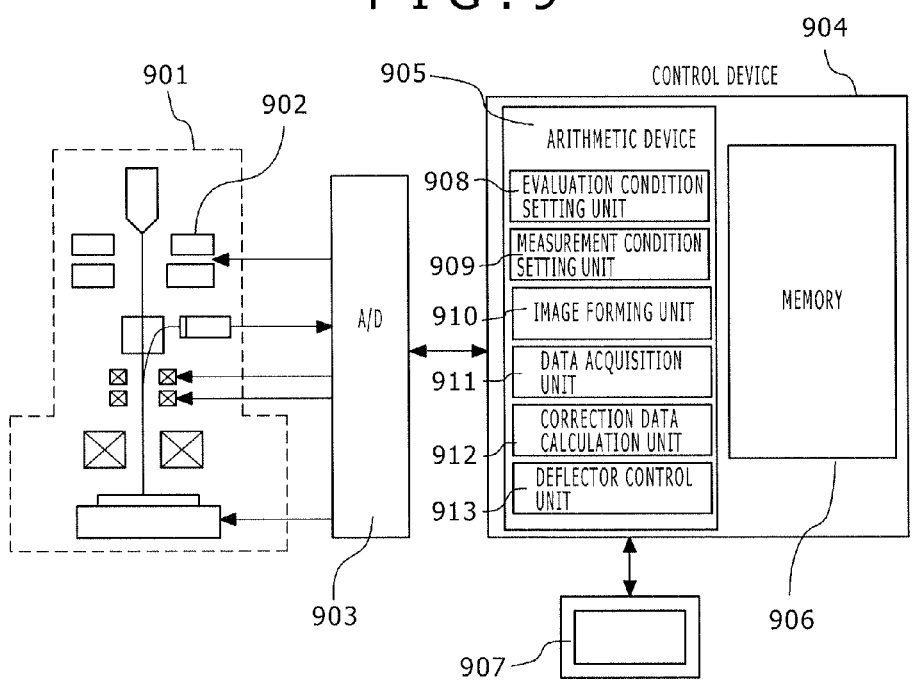
FIG. 9 is a schematic configuration diagram of a semiconductor measurement and inspection system including the SEM.

FIG. 9 is a schematic configuration diagram of a semiconductor measurement and inspection system including the SEM. This system includes an SEM main body 901, an A/D converter 903, and a control device 904.

The SEM main body 901 irradiates the specimen such as a semiconductor wafer with the electron beam, captures the electrons emitted from the specimen by a detector 902, and converts the electrons into a digital signal by the A/D converter 903. The digital signal is input to the control device 904, stored in a memory 906, and subjected to image processing according to the purpose by an image processing hardware such as a CPU. Also, an arithmetic device 905 has a function of creating a line profile on the basis of the detection signal, and measuring the dimension between the peaks of the profile.

Further, the control device 904 has a function of a GUI (graphical user interface) that is connected to an input device 907 having input means, and displays an image or the measurement results on a display device disposed in the input device 907, or an external display (not shown) for an operator.

A part or all of the control or processing in the control device 904 can be allocated to a computer having a CPU and a memory that can store an image, and processed and controlled. Also, the control device 904 can read an imaging recipe coordinates of an electronic device required for the measurement, a pattern matching template used for positioning, and an imaging condition from the memory, or can be connected to an imaging recipe creating device that creates the above recipe manually or with the use of design data of the electronic device through a network.

Figure 3:
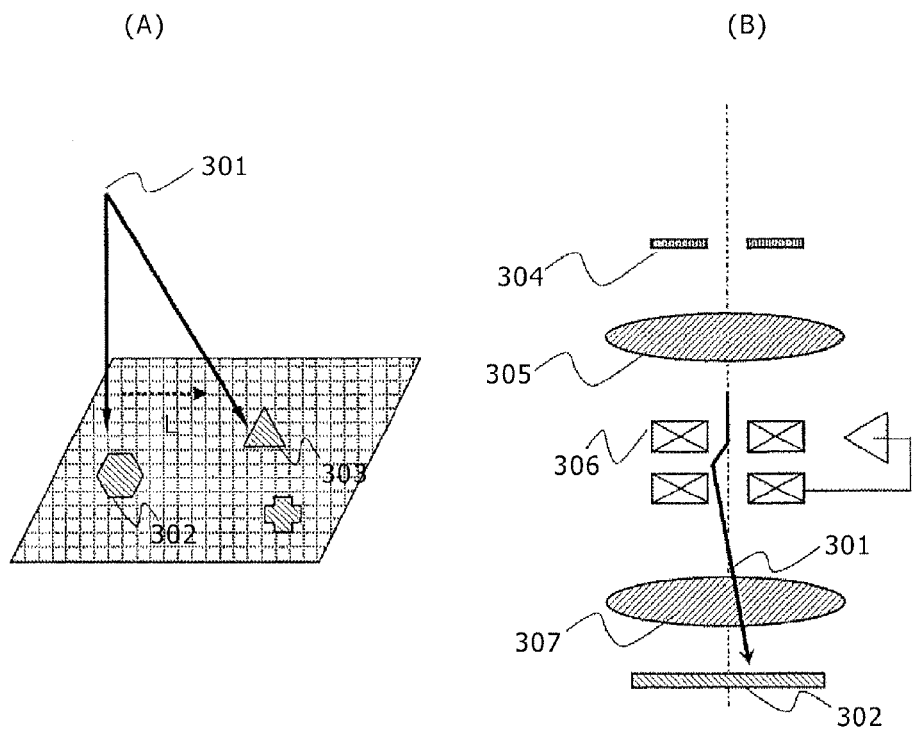
FIGS. 3A and 3B are schematic illustrative views of a principle of deflection control of an SEM by electron beam scanning.

A basic concept of the beam deflection in the SEM will be described with reference to FIG. 3. FIG. 3 (A) is a schematic cross-sectional view of the electronic beam deflection on the specimen. It is assumed that a width when an electron beam 301 is defected from a certain pattern 302 to a pattern 302 is L. FIG. 3 (B) illustrates a positional relationship of a lens, a deflector, and a scanning coil in the electron optical system of the SEM. After the electron beam 301 has passed through an objective aperture hole 304, and the electron beam 301 is converted on a condenser lens 305, and a specimen surface 308 is scanned with the electron beam 301. In this situation, a given electric field or magnetic field is applied to a deflector 306 disposed above an objective lens 307 whereby the electron beam is changed to a location designated with a given width, the specimen surface 308 is scanned with the electron beam at a designated magnification to acquire an image under the adjustment. The beam deflection is called "image shift", and control operation amounts IS(X)(LSB) and IS(Y)(LSB) of the an image shift X/Y coil, and image shift real operation amount, that is, physical moving distances ($L_{def}(X)(\mu m)$ and $L_{def}(Y)(\mu m)$ satisfy relational expressions (1) and (2) described below.

$$IS(X)(LSB)=A*L_{def}(X)(\mu m)+B*L_{def}(Y)(\mu m) \quad (1)$$

$$IS(Y)(LSB)=C*L_{def}(X)(\mu m)+D*L_{def}(Y)(\mu m) \quad (2)$$

A, B, C, and D each have correction tables of a deflection control operation amount and a real deflection physical distance, which conduct calibration with the use of a pattern from which a given distance is found in advance at the time of adjusting the device, which are given coefficients for correcting the beam deflection and the beam rotation at the time of deflecting the beam. Hence, the physical moving distances $L_{def}(X)$ and $L_{def}(Y)$ are obtained in back calculation according to the control deflection amount of the image shift at the time of the real measurement length with the user of the above expressions (1) and (2).

Figure 4:
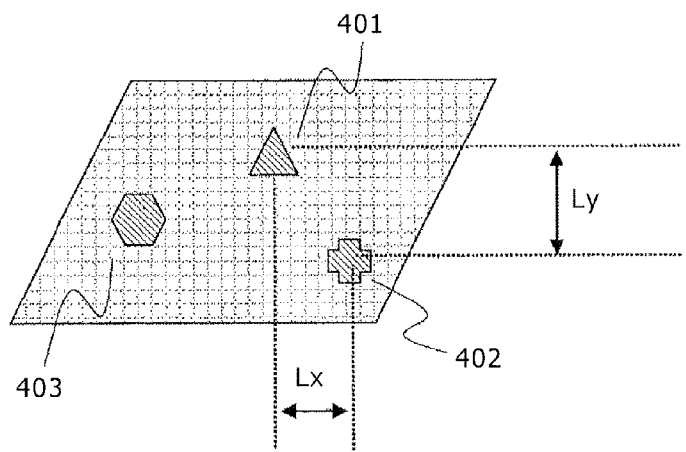
FIG. 4 is a diagram illustrating a principle of a high precision measurement method between arbitrary patterns.

FIG. 4 illustrates a principle of a high precision measurement method between arbitrary patterns. Patterns 401 and 402 to be measured are arranged on the specimen to obtain distances Lx and Ly between both of those patterns. The pattern shapes are different from a line or a hole, and it is difficult to place a conventional rectangular measurement box, detect a line profile, and obtain a pattern dimension by waveform processing.

Also, in order to ensure a constant measurement precision under the present circumstances, it is general to use a high magnification SEM condition. For example, when a measurement magnification is 100 k or higher, the field of view becomes 1.35 μm or lower, and if the distance between both of the patterns is 10 μm or larger, it is impossible that both of those patterns fall within the field of view at the high magnification. Conversely, when the magnification drops, and both of those patterns fall within the field of view to conduct the measurement, the measurement precision securement at the low magnification is difficult. Both of the high magnification measurement and the extensive range measurement are performed in the present measuring technique.

Figure 7:
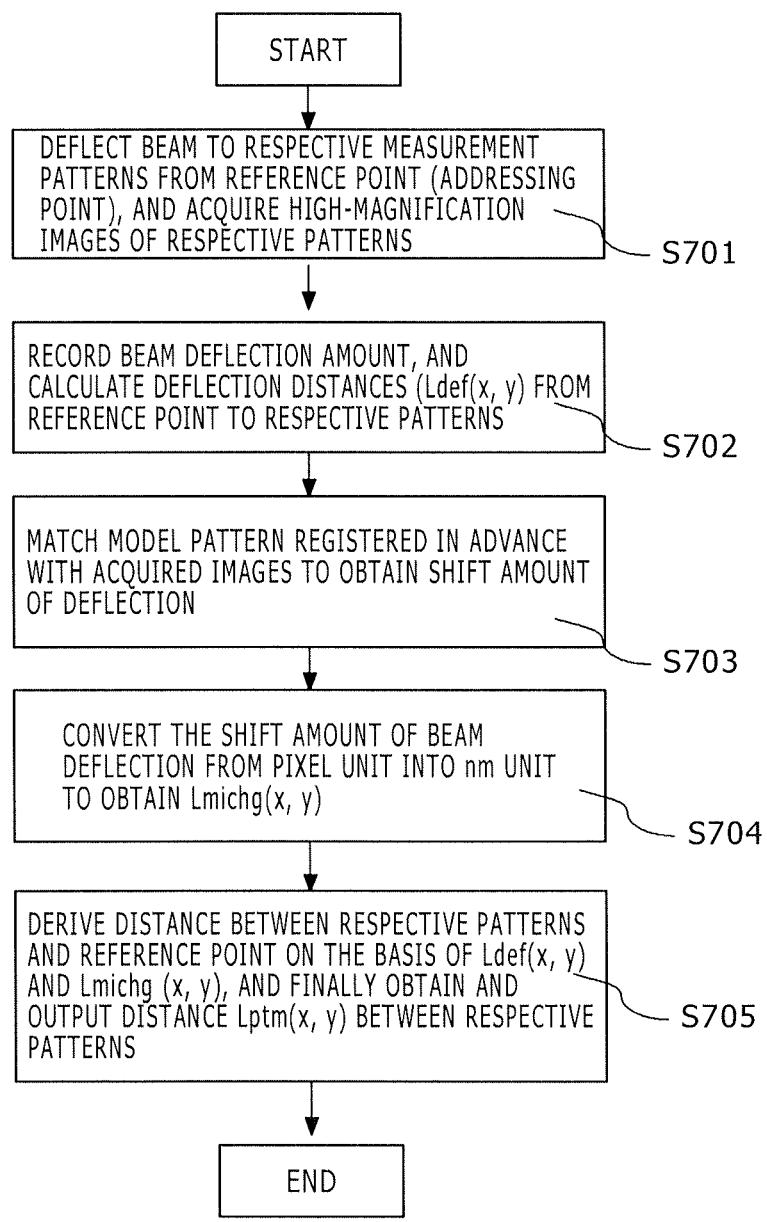
FIG. 7 is a flowchart illustrating a process of obtaining a distance between arbitrary patterns on the basis of the combination of beam deflection and pattern matching.

In this embodiment, a method of solving both of the measurement arrangement problem of the arbitrary pattern, and the measurement precision at the high magnification and in the extensive range is provided. A specific flow of the distance measurement between the arbitrary patterns by the beam deflection and the pattern matching will be described with reference to FIG. 7. First, the stage is controlled, and moves to a reference point pattern 403 which is close to patterns 401 and 402 which are measurement targets. The beam is deflected to the respective patterns 401 and 402 from the reference point pattern 403 to acquire the high magnification SEM images of the respective patterns (S701). Then, the control amount (LSB unit) at the time of deflecting the beam is read from the control system to calculate real deflection distances, that is, the pattern distances (μm unit) $L_{def}(X1,Y1)$ (pattern 401 to pattern 403) and $L_{def}(X2, Y2)$ (pattern 402 to pattern 403) from the reference point with the use of the above expressions (1) and (2).

In this example, the distance between the patterns 401 and 402 can be calculated (S702) once. However, the positioning precision of the beam deflection is limited to the electric control performance, that is, about tens of nm, and the measurement precision for evaluating the device performance is yet insufficient for a sub-nm level. In S703 to S705, the shift of the beam deflection is corrected through the SEM image processing of the respective patterns at the above high magnification, and an error of the deflection is absorbed to achieve the measurement precision of the sub-nm level.

Figure 5:
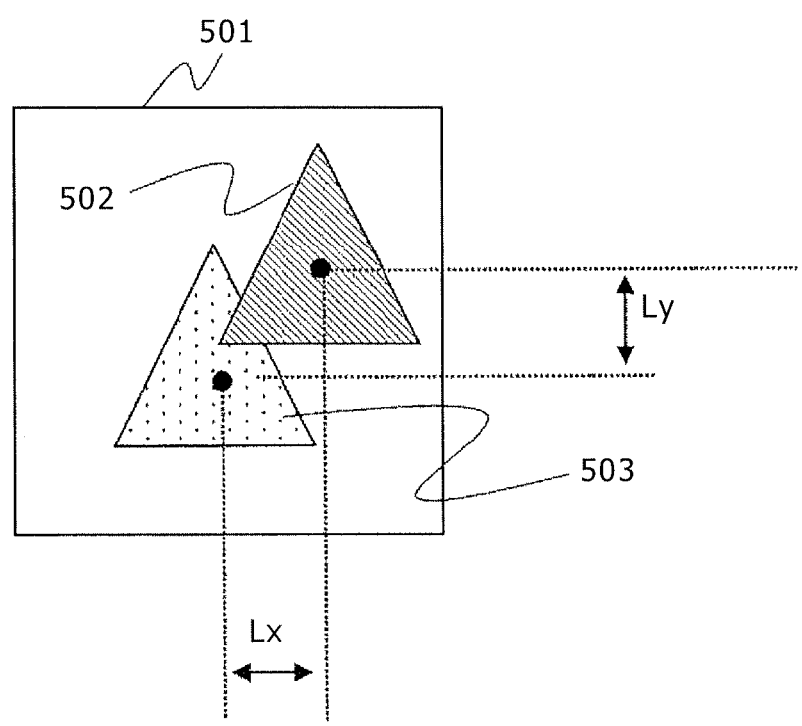
FIG. 5 is a diagram illustrating a method of correcting a beam deflection amount shift by image matching.

FIG. 5 illustrates an example of image matching. An image acquired at a deflection destination from the reference point at the high magnification is matched with an image registered in advance (S703). The pattern 401 is acquired as an SEM image 502 within a high magnification SEM visual field 501. However, a location shift from an image 503 registered in advance is generated by the shift of the deflection amount. Conversely, the shift amount can be calculated by pattern matching, and image matching techniques are diverse, and several examples thereof will be described in the subsequent section. As one method, the respective centers of gravity of the patterns 502 and 503 are calculated, a positional difference between the centers of gravity is derived, and an image processing pixel unit is converted into a μm unit to obtain the shift amount of the image, that is, error correction amounts $L_{mtchg}(X1, Y1)$ (pattern 401 to pattern 403) and $L_{mtchg}(X2, Y2)$ (pattern 402 to pattern 403) of the deflection amount. When combined with the above deflection amount, the distance from the reference point pattern is expressed as follows:

$$L_{ptrn}(X1,Y1) = L_{mtchg}(X1,Y1) + L_{def}(X1,Y1) \quad (3)$$

$$L_{ptrn}(X2,Y2) = L_{mtchg}(X2,Y2) + L_{def}(X2,Y2) \quad (4)$$

A distance $L_{ptrn}(X,Y)$ between the patterns 402 and 403 is expressed as follows:

$$L_{ptrn}(X,Y) = L_{ptrn}(X1,Y1) - L_{ptrn}(X2,Y2) \quad (5)$$

In the image processing, the pixel unit is converted into the μm unit by the following expression (6).

Distance (μm) per pixel=image size/(measurement magnification×scan pixel) (6)

Figure 6:
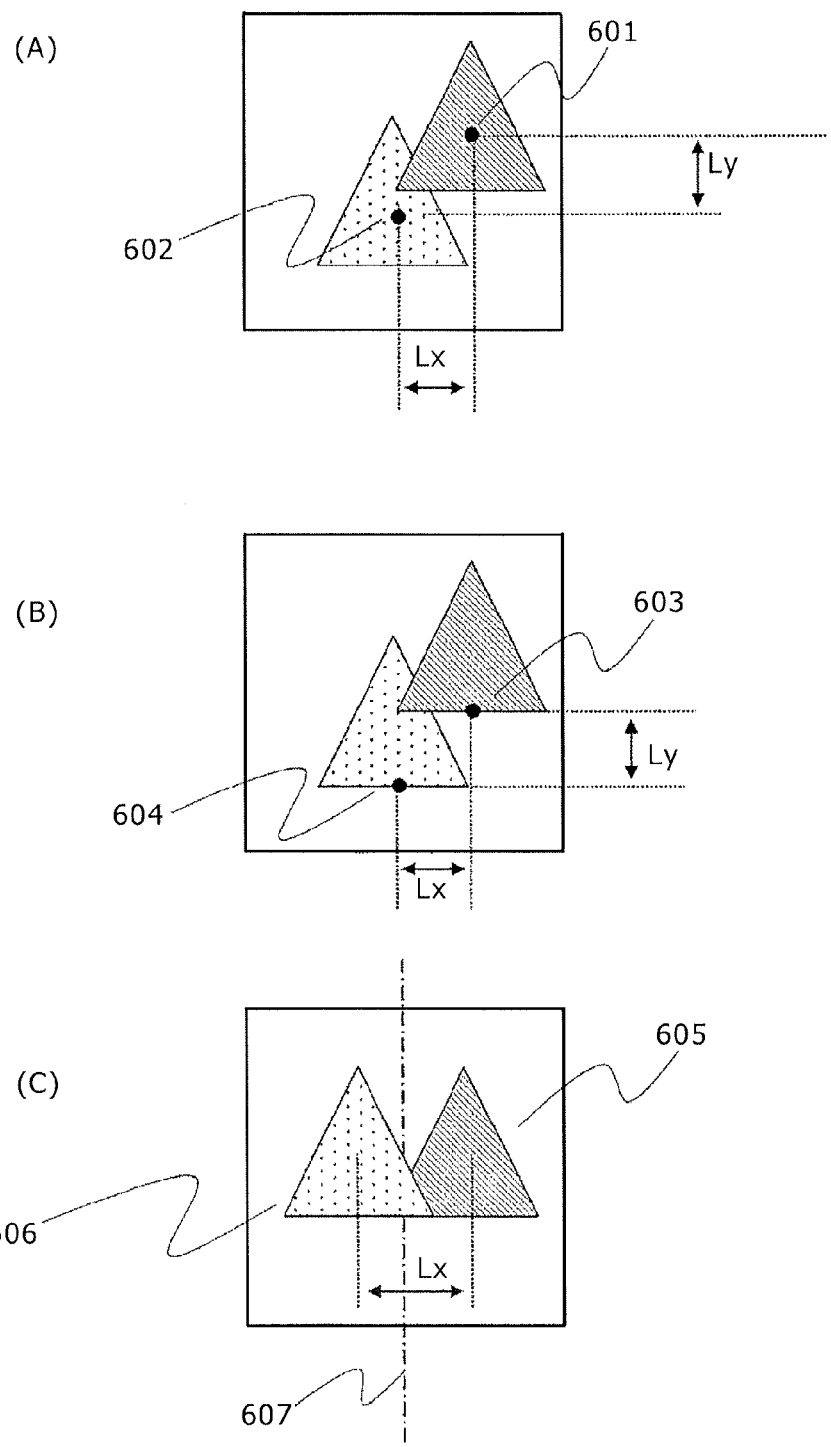
FIG. 6 illustrates an outline of pattern matching.

FIG. 6 illustrates several examples of the image pattern matching. In FIG. 6 (A), as described in FIG. 5, a distance between the center of gravity 601 of the image acquired by calculating the center of gravity, and the center of gravity 602 of the registered model is obtained as the shift amount of the pattern matching. In FIG. 6 (B), a distance between a base midpoint 603 of the acquired image and a base midpoint 604 of the registered model as a midpoint position of a base of a triangle pattern is calculated as the shift amount of the pattern matching. In the case of FIG. 6 (C), the symmetric pattern is effective, and the image 606 is folded with respect to the center axis 607 of the acquired image 605 to detect the shift amount from the center symmetric axis. In this case, the pattern registration in advance is unnecessary, and the shift amount is obtained with precision of 1/10 or lower of the pixel.

In this example, several simple image processing techniques are provided. If the real device pattern is complicated, the rotation of the pattern and a scale variation can be processed to derive the shift amount with high precision, with the use of a normalized correlation method extensively applied as the pattern matching. In order to improve the edge detection precision of the image processing, it is effective to smooth or differentiate the profile of the edge. It is important that the real device evaluation is optimized by a given matching technique or the combination of several matching techniques after correlativity with the device performance is verified.

Although an error of the image matching is slightly different depending on the technique, if the image matching is conducted with the use of the above technique, the precision to the sub-pixel level can be obtained. When the SEM magnification is 100 k, image scan pixels are 1024, and the image size is 135 mm, a size corresponding to one pixel is 135 mm/(1024×100 k) to 1.3 nm. Therefore, if the shift amount of the deflection amount is corrected by the image matching of the sub-pixel degree, the distance measurement precision can be achieved with high precision of zero point nano level. If the image of not low magnification but high magnification in the respective patterns is acquired to measure the distance in a beam deflectable range, the precision can be kept. In this technique, the shift amount is calculated by the pattern matching, the box arrangement in the conventional measurement technique is unnecessary. Hence, even in the arbitrary pattern different from the line or the hole, if the registration model and the image processing are conducted, the measurement can be conducted.

The patterns described in this embodiment are exemplary, and not limited to this configuration. In FIG. 4, reference numeral 401 is the reference point, and 402 and 403 are the patterns to be measured. Alternatively, the pattern 402 per se to be measured is set as the reference pattern, and a distance between the patterns 402 and 403 can be measured. The distance measurement between the two patterns is exemplary. However, the same is applied to plural patterns, and the distance measurement between the respective patterns can be conducted. In the case of the plural patterns, the measurement of similar patterns is averaged, and the measurement precision can be further improved by N times.

A difference in the beam deflection amount, and a difference in the scanning width of the SEM image due to the magnification switching at the time of measurement or the switching of an electro-optical mode are corrected with the use of the same standard specimen at the time of adjusting the device in advance to minimize an error between the modes and an error between the magnifications, and enable evaluation on the same basis. In the specimen such as insulator which is easily chargeable, the measurement precision of the position shift is deteriorated due to the image drift, but it is effective to suppress the image drift caused by the switching of the electro-optical system to cope with the insulator, and maintain the measurement precision of this technique. In the pattern deformable by electron beam irradiation such as a specimen with a resist, a symmetrical pattern as much as possible is selected as a reference point, and the image deformation is minimized to reduce an error of matching.

Second Embodiment

Figure 10:
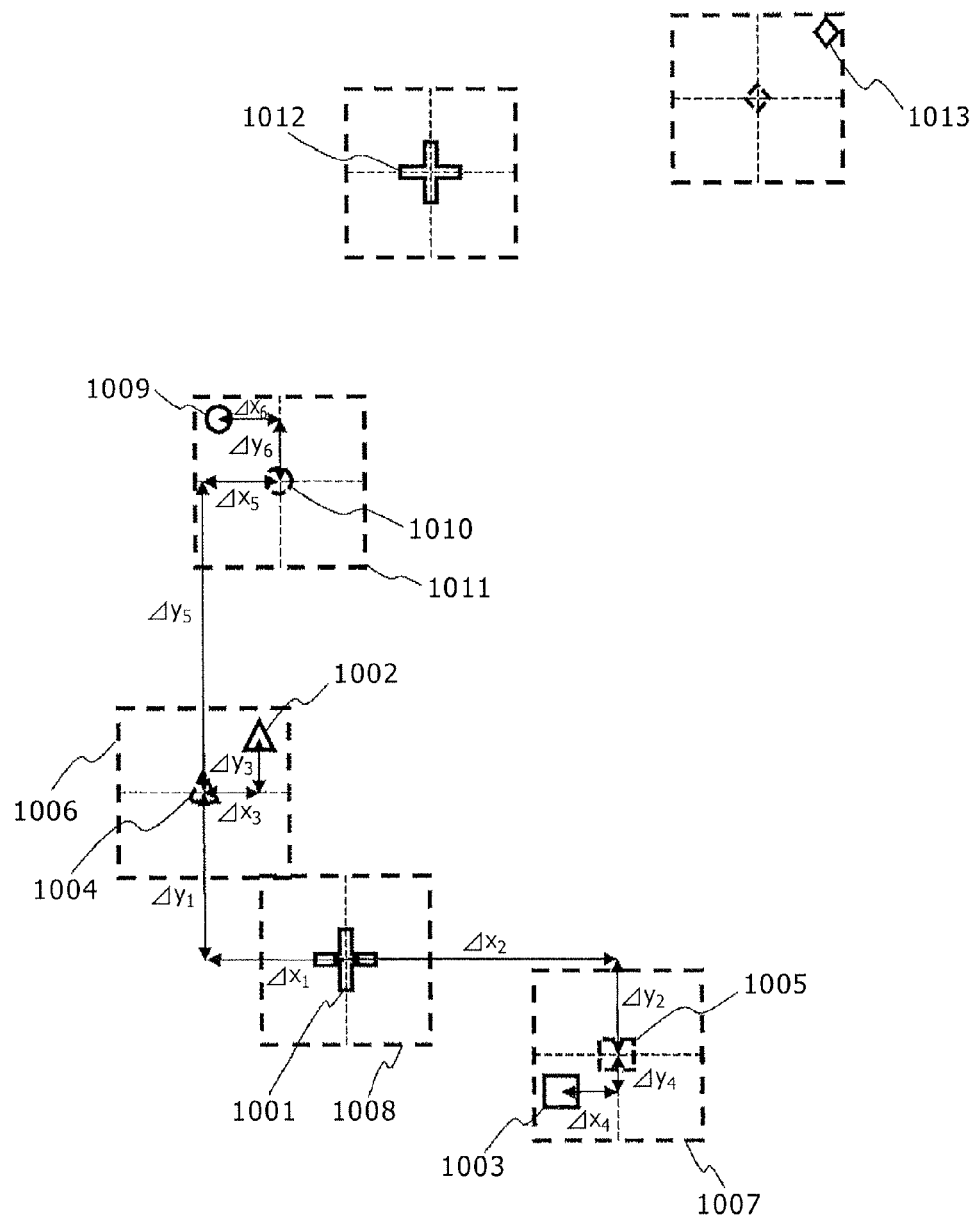
FIG. 10 is a diagram illustrating a principle of measuring a dimension between the patterns on the basis of the beam deflection and the pattern matching within a high magnification image.

Subsequently, another measuring method using the deflection of a beam and the pattern matching will be described. FIG. 10 is a diagram illustrating an example of measuring a dimension between an addressing pattern 1001 and a surrounding pattern to be measured, or between a reference pattern and a pattern to be measured. In the same manner as that in the first embodiment, a dimension between a triangle pattern 1002 and a square pattern 1003 can be measured with the use of the addressing pattern 1001. In this case, dimensions Δxs and Δys between the triangle pattern 1002 and the square pattern 1003 can be obtained according to given beam deflection amounts (Δx1, Δy1) and (Δx2, Δy2), and shift amounts (Δx3, Δy3) and (Δx4, Δy4) obtained on the basis of the pattern matching within high magnification images 1006 and 1007 as follows.

$$\Delta xs = \Delta x1 + \Delta x2 + \Delta x3 + \Delta x4 \quad (7)$$

$$\Delta ys = \Delta y1 + \Delta y2 + \Delta y3 + \Delta y4 \quad (8)$$

A position 1004 and a position 1005 are deflection target positions based on the addressing pattern 1001. Also, the beam is deflected by a deflection amount (Δx5, Δy5) with reference to the position 1004, and a shift amount (Δx5, Δy5) between a position 1010 and a circle pattern 1009 can be obtained to obtain a distance between the triangle pattern 1002 and the circle pattern 1009. The present invention can be applied to the dimension measurement not only between the addressing pattern and the fine pattern, but also between the fine patterns.

Also, upon measuring the respective dimensions, the stage moves. Then, if the dimension between the addressing pattern 1012 and the circle pattern 1009, and the dimension between the addressing pattern 1012 and a diamond pattern 1013 are obtained in the same manner as that of the above embodiment upon searching an addressing pattern 1012, the dimension between the square pattern 1003 and the diamond pattern 1013 can be obtained. In this case, because the position of a common pattern (circle pattern 1009) is specified with the use of the two addressing patterns 1001 and 1012 before and after the stage moves, a high precision measurement can be conducted even between the patterns distant from each other caused by the stage movement.

Figure 11:
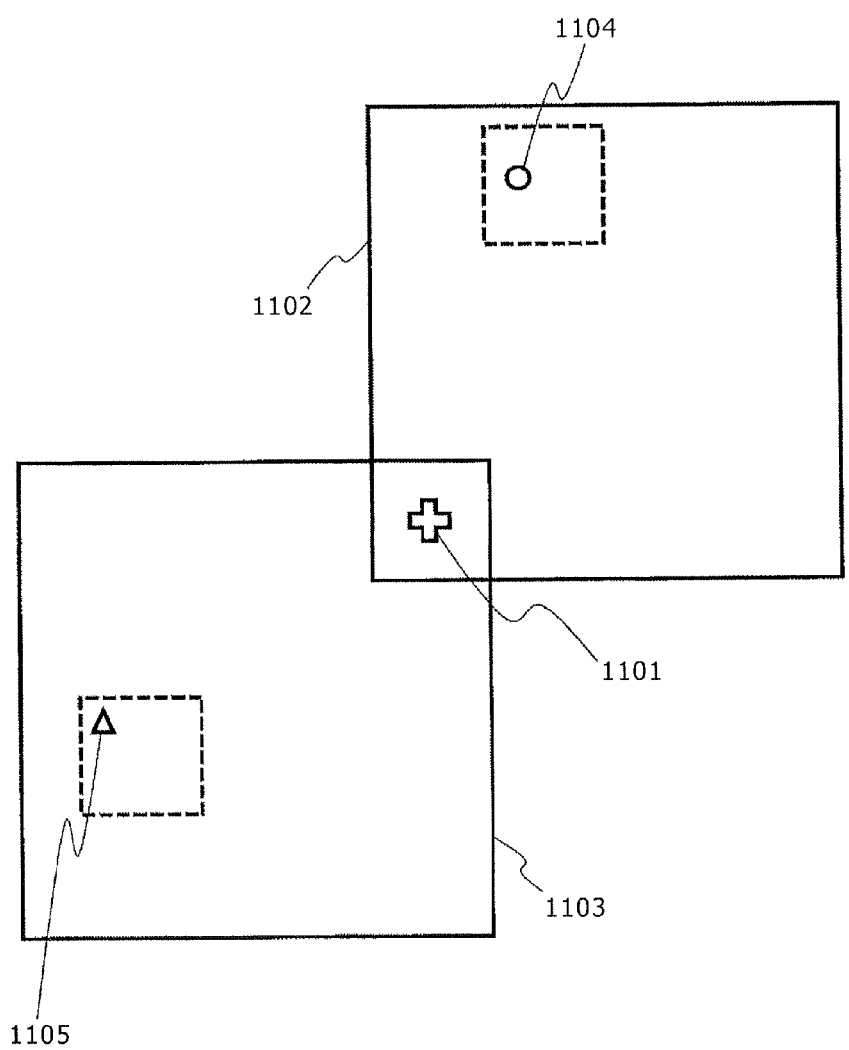
FIG. 11 is a diagram illustrating a principle of a measurement method for measuring a dimension between two different patterns by allowing a common reference pattern to fall within two fields of view.

Further, as exemplified in FIG. 11, a dimension between patterns 1104 and 1105 included in two low magnification images 1102 and 1103 obtained by the movement of the field of view attributable to the stage movement can be also measured. In this case, the image is acquired so that the same addressing pattern 1101 is included in both of the two low magnification images 1102 and 1103. Even in this technique, the high precision measurement can be conducted on even the dimension between the patterns distant from each other attributable to the stage movement.

Figure 12:
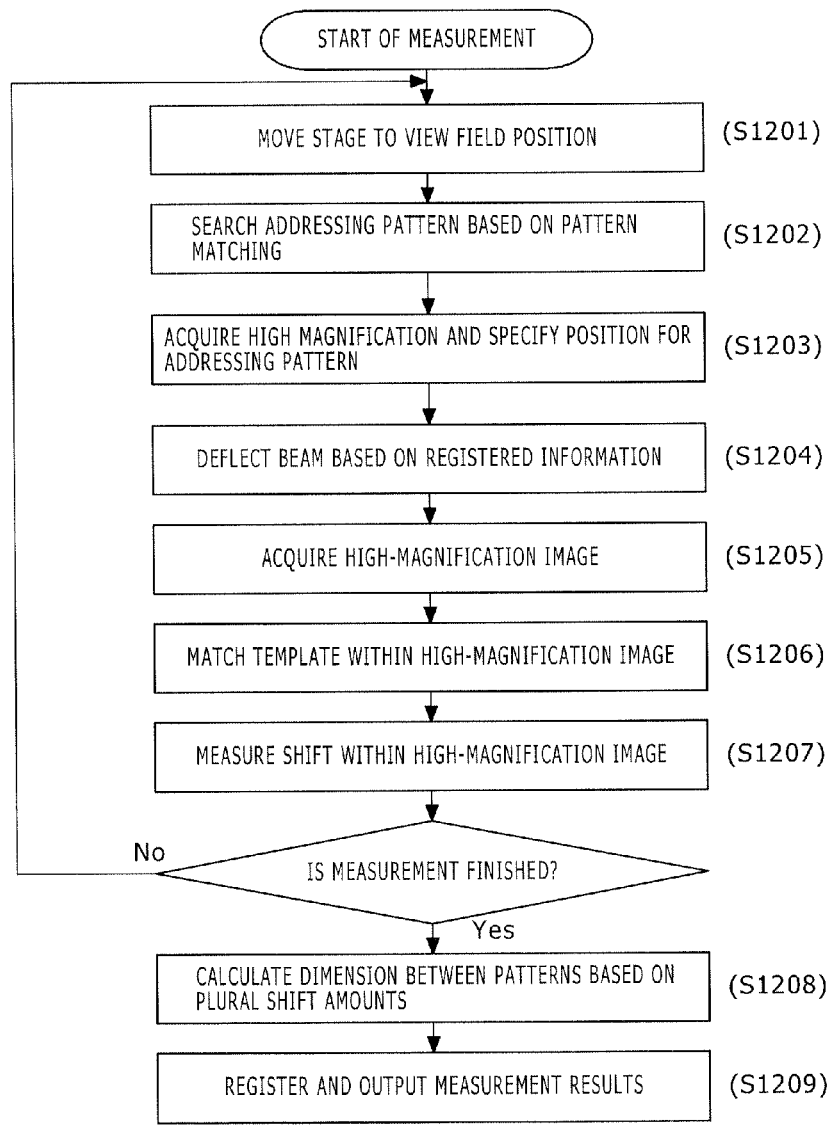
FIG. 12 is a flowchart illustrating a dimension measuring process based on the beam deflection and the pattern matching within the high magnification image.

FIG. 12 is a flowchart illustrating a process of measuring a dimension between two patterns attributable to the stage movement with high precision. First, the stage movement for positioning a beam irradiation position in a viewing area including a first pattern to be measured and an addressing pattern is conducted (Step 1201). Then, the pattern matching is executed to search addressing pattern data (Step 1202). In this example, in order to more precisely specify a position of the addressing pattern, an image is acquired while narrowing the field of view as compared with an image in which the addressing pattern is searched, and an accurate position of the addressing pattern is specified, for example, on the basis of a difference between a reference position (for example, image center position) and a center position of the addressing pattern (Step 1203). In an example of FIG. 10, an image 1008 of the field of view having the same size as that of the pattern to be measured is acquired. This differential data may be superimposed on a beam deflection amount (Δx1, Δy1) to obtain a distance between the addressing pattern and the object to be measured.

Subsequently, the beam is deflected on the basis of distance information between an address pattern registered in advance and the pattern to be measured, or deflection signal information (Step 1204). Then, a high magnification image (an image of a high magnification relative to the image used in addressing in Step 1202) is acquired in a deflection destination (Step 1205). Template matching is conducted within the high magnification image thus obtained (Step 1207), and the shift is measured on the basis of a difference between a matching position and the reference position (Step 1207).

In this situation, if all of the measurements are completed, the obtained plural dimensions between the patterns are added to calculate the dimension between the patterns away from each other (Step 1208), and the measurement results are registered or output to a display image (Step 1209). Also, if the acquisition of necessary data has not yet been completed, the stage moves so as to acquire an image including another addressing pattern, or another pattern to be measured, and the process of Steps 1202 to 1207 is repeated.

According to the measuring device that executes the above measuring process, or the computer program that causes the computer to execute the above measurement, the dimension measurement between the patterns away from each other attributable to the stage movement can be conducted with high precision.

LIST OF REFERENCE SIGNS

101, electron gun
102, electron beam
103, accelerating electrode
104, 305, condenser lens
105, 306, deflector
106, 307, objective lens
107, specimen
108, specimen holder
109, specimen stage
110, booster electrode
111, reflected electrons
112, secondary electrons
113, reflective plate
114, 902, reflective plate
115, signal processing device
116, image display unit
117, conversion electrode
201, 202, 205, 206, pattern
203, 204, pattern intensity distribution
207, conventional measurement arrangement box
301, electron beam
302, 303, 401, 402, 502, 605, image pattern formed on specimen
304, objective aperture hole
403, reference point pattern
501, image visual field
503, model pattern registered in advance
601, 602, center of gravity of image formed on specimen
603, 604, base center point of image pattern formed on specimen
606, pattern where image pattern formed on specimen is symmetrically folded
607, symmetrical axis
801a, shield mesh
801b, filter mesh
802, opening
803, power supply
804a, reflected electron detector
804b, secondary electron detector
901, SEM main body
903, A/D converter
904, control device
905, arithmetic device
906, memory
907, input device
908, evaluation condition setting unit 909, measurement condition setting unit
910, image forming unit
911, data acquisition unit
912, correction data calculation unit
913, deflector control unit

The invention claimed is:

1. A pattern dimension measuring device that measures a dimension of a pattern formed on a specimen or between different patterns with the use of an acquired image, comprising:
  an arithmetic device that moves a field of view with reference to a first pattern formed on the specimen on the basis of predetermined first distance information, acquires a first image, executes template matching with the use of the first image and a matching template, and calculates a distance between a second pattern included in the first image and the first pattern on the basis of second distance information obtained by the template matching, and the first distance information.

2. The pattern dimension measuring device according to claim 1, further comprising:
  a scanning electron microscope having a deflector for moving the field of view.

3. The pattern dimension measuring device according to claim 2,
  wherein the arithmetic device calculates a distance between the first pattern and the second pattern on the basis of a dimension value corresponding to a moving distance of the deflector.

4. A charged particle beam apparatus, comprising:
  a charged particle source that emits a charged particle beam;
  an accelerating electrode that accelerates the charged particle beam;
  a deflector that deflects the charged particle beam;
  an objective lens that converges the charged particle beam;
  a specimen stage on which a specimen is mounted;
  a charged particle detector that detects charged particles; and
  a control device that supplies a signal to the deflector,
  wherein the control device includes an arithmetic unit that corrects a dimension between a reference pattern and a different pattern on the basis of a shift of the amount of deflection obtained on the basis of pattern matching using an image obtained when deflecting the charged particle beam from the reference pattern to the different pattern, and scanning the different pattern with the charged particle beam.

5. The charged particle beam apparatus according to claim 4,
  wherein the deflector comprises an image shift deflector for moving a scanning position of the charged particle beam.

6. The charged particle beam apparatus according to claim 4,
  wherein the arithmetic unit calculates the dimension between the reference pattern and the different pattern on the basis of an addition of a dimension value corresponding to a deflection signal of the deflector, and a dimension value corresponding to the shift.

7. The charged particle beam apparatus according to claim 4,
  wherein the arithmetic unit calculates the moving distance when deflecting the charged particle beam on the basis of the following arithmetic expressions:

$$IS(X)(LSB)=A*L_{def}(X)+B*L_{def}(Y)$$

$$IS(Y)(LSB)=C*L_{def}(X)+D*L_{def}(Y)$$

where $IS(X)(LSB)$ and $IS(Y)(LSB)$ are control operation amounts, $L_{def}(X)$ and $L_{def}(Y)$ are moving distances when deflecting the charged particle beam, and A, B, C, and D are given coefficients.

8. A non-transitory computer readable medium containing A computer program that causes a computer to calculate a dimension of a pattern formed on a specimen or between different patterns with the use of an acquired image,
  wherein the program moves a field of view with reference to a first pattern formed on the specimen on the basis of predetermined first distance information, acquires a first image, executes template matching with the use of the first image and a matching template, and calculates a distance between a second pattern included in the first image and the first pattern on the basis of second distance information obtained by the template matching, and the first distance information.

* * * * *